US010855288B2

(12) United States Patent
Kvatinsky et al.

(10) Patent No.: US 10,855,288 B2
(45) Date of Patent: Dec. 1, 2020

(54) LOGIC DESIGN WITH UNIPOLAR MEMRISTORS

(71) Applicant: Technion Research & Development Foundation Limited, Haifa (IL)

(72) Inventors: Shahar Kvatinsky, Ramat-Gan (IL); Avishay Drori, Tel-Aviv (IL); Elad Amrani, Beer-Sheva (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 16/407,203

(22) Filed: May 9, 2019

(65) Prior Publication Data
US 2019/0326913 A1    Oct. 24, 2019

Related U.S. Application Data

(62) Division of application No. 15/603,528, filed on May 24, 2017, now Pat. No. 10,516,398.

(60) Provisional application No. 62/340,559, filed on May 24, 2016.

(51) Int. Cl.
*H03K 19/20* (2006.01)
*G11C 13/00* (2006.01)

(52) U.S. Cl.
CPC ......... *H03K 19/20* (2013.01); *G11C 13/0002* (2013.01); *G11C 2213/75* (2013.01)

(58) Field of Classification Search
CPC . H03K 19/20; G11C 13/0002; G11C 13/0069
USPC ..................................................... 326/4, 104
See application file for complete search history.

(56) References Cited

U.S. PATENT DOCUMENTS

| 7,902,857 | B1* | 3/2011 | Pino | G11C 13/0069 326/14 |
| 8,427,203 | B2* | 4/2013 | Pino | G11C 13/0007 326/101 |
| 8,587,988 | B2* | 11/2013 | Linn | G11C 13/004 365/148 |
| 9,548,741 | B1* | 1/2017 | Kvatinsky | H03K 19/17708 |
| 9,887,352 | B2* | 2/2018 | Bessonov | H01L 45/146 |
| 2006/0028247 | A1 | 2/2006 | Hara et al. | |
| 2006/0092691 | A1 | 5/2006 | Shiimoto et al. | |
| 2011/0106742 | A1* | 5/2011 | Pino | G06N 3/0635 706/33 |
| 2012/0063192 | A1 | 3/2012 | Lee | |
| 2012/0105159 | A1* | 5/2012 | Strachan | H03B 7/02 331/2 |
| 2012/0194967 | A1 | 8/2012 | Keane et al. | |
| 2012/0212255 | A1* | 8/2012 | Jeong | G11C 13/004 326/38 |
| 2012/0217994 | A1* | 8/2012 | Pino | H03K 19/173 326/38 |
| 2013/0176766 | A1 | 7/2013 | Pickett et al. | |

(Continued)

OTHER PUBLICATIONS

"MAGIC—Memristor-Aided Logic" Kvatinsky et al. IEEE Transactions on Circuits and Systems: Express Briefs vol. 61 No. 11 Nov. 2014 (Year: 2014).*

(Continued)

*Primary Examiner* — Jason Crawford

(57) ABSTRACT

Logic gates are made from first and second resistive elements connected together to form a voltage divider. One or both of the resistive elements is a unipolar memristor. OR and NOT gates may be constructed to make a digital logic system.

5 Claims, 9 Drawing Sheets

(56) References Cited

U.S. PATENT DOCUMENTS

| | | | | |
|---|---|---|---|---|
| 2014/0028347 | A1* | 1/2014 | Robinett | H03K 19/17712 326/38 |
| 2015/0236697 | A1* | 8/2015 | Miao | H03K 19/1733 326/38 |
| 2015/0256178 | A1* | 9/2015 | Kvatinsky | H03K 19/177 326/31 |
| 2015/0332763 | A1* | 11/2015 | Yilmaz | G11C 13/0064 365/148 |
| 2016/0012876 | A1* | 1/2016 | Di Ventra | G11C 11/4091 365/149 |
| 2016/0020766 | A1* | 1/2016 | Miao | H03K 19/0813 326/37 |
| 2016/0055907 | A1* | 2/2016 | Buchanan | G11C 16/06 326/38 |
| 2016/0328578 | A1* | 11/2016 | Plusquellic | G09C 1/00 |
| 2017/0141302 | A1 | 5/2017 | Bessonov et al. | |
| 2017/0337968 | A1* | 11/2017 | Jagtap | G11C 13/004 |
| 2017/0345497 | A1 | 11/2017 | Kvatinsky et al. | |
| 2018/0159536 | A1* | 6/2018 | Swartzlander | G11C 13/0069 |
| 2019/0056915 | A1* | 2/2019 | Jabir | H03K 19/173 |

OTHER PUBLICATIONS

Official Action dated May 24, 2019 From the US Patent and Trademark Office Re. U.S. Appl. No. 15/603,528. (13 Pages).

Kvatinsky et al. "MAGIC—Memristor-Aided Logic", IEEE Transactions on Circuits and Systems-II: Express Briefs, 61(11): 895-899, Nov. 2014.

Satat et al. "Logic Design with Memristors", Technion Israel, B.S.c Semesterial Project—Winter 2011-2012, 96 pages.

Notice of Allowance dated Feb. 1, 2019 From the US Patent and Trademark Office Re. U.S. Appl. No. 15/603,528. (9 pages).

Official Action dated Mar. 8, 2018 From the US Patent and Trademark Office Re. U.S. Appl. No. 15/603,528. (12 pages).

Official Action dated Sep. 22, 2017 From the US Patent and Trademark Office Re. U.S. Appl. No. 15/603,528. (13 pages).

Restriction Official Action dated Sep. 12, 2018 From the US Patent and Trademark Office Re. U.S. Appl. No. 15/603,528. (7 pages).

Amrani et al. "Logic Design With Unipolar Memristors", 2016 IFIP/IEEE International Conference on Very Large Scale Integration, VLSI-SoC, 5 P., Sep. 26, 2016.

* cited by examiner

LOGIC DESIGN WITH UNIPOLAR MEMRISTORS

RELATED APPLICATION

This application is a division of U.S. patent application Ser. No. 15/603,528 filed on May 24, 2017, which claims the benefit of priority under 35 USC § 119(e) of U.S. Provisional Patent Application No. 62/340,559 filed on May 24, 2016, the contents of which are incorporated herein by reference in their entirety.

FIELD AND BACKGROUND OF THE INVENTION

The present invention, in some embodiments thereof, relates to a logic design using memristors and, more particularly, but not exclusively, to a set of two logic blocks that allow full logic systems to be constructed therefrom.

As transistors continue to shrink in size, leakage current increases. In contemporary microprocessors, leakage has ceased being a negligible part of the power consumption. This fact is a key motivation for using non-volatile devices, such as memristors, in processing elements to reduce leakage current. Memristors are non-volatile circuit elements, predicted in 1971 by Leon Chua. In 2008, Hewlett Packard laboratories were the first to link resistive switching materials to the theory of memristors. As Chua suggested, we refer to all memristive devices as memristors, in the sense that all of the latter are two-terminal non-volatile memory devices based on resistance switching. Many types of materials can be associated with memristive behavior. These materials vary from molecular and ionic thin film semiconductors, through spin based and magnetic memristive systems, to phase change memories.

Switching in a memristive device, refers to the transition from one resistance state to another. Commonly, we distinguish between a high resistance state (HRS="OFF") and a low resistance state (LRS="ON"). In the present application, LRS and HRS are considered, respectively, as logical '1' and '0'. One prominent distinction of switching mechanisms is the classification of bipolar and unipolar switching. This classification is illustrated in FIGS. 1A-1B, which illustrates curves I-V of (a) unipolar and (b) bipolar switching mechanisms of memristors. For bipolar switching, a transition from HRS→LRS (SET) occurs at a negative voltage ($-V_{SET}$), while the transition from LRS→HRS (RESET) occurs at a positive voltage ($V_{RESET}$). In the case of unipolar switching, a transition from HRS→LRS occurs when crossing a voltage threshold ($V_{SET}$ or $-V_{SET}$). Typically, the current during the transition may be limited below a compliance current to avoid overloading the device. Resetting back to the OFF state happens at a voltage below $V_{SET}$ and above $V_{RESET}$ (or above $-V_{SET}$ and below $-V_{RESET}$). A higher current is needed for switching to the OFF state. Unlike bipolar memristors, both transitions are independent of the voltage polarity.

The exact physical mechanism that promotes switching differs between devices and can be generally classified as thermal, electronic, or ionic. Bipolar switching is linked to cation/anion migration whereas unipolar switching is linked to the creation or dissolution of conducting filaments—this is often referred to as the fuse-antifuse mechanism. Both bipolar and unipolar memristors have already been incorporated into memory designs, and are also suggested to be used for performing logic operations. Some unipolar memristors have a high $R_{OFF}/R_{ON}$ ratio (HRS/LRS ratio), which makes them attractive candidates to perform logic operations due to a high noise margin. This increases motivation to choose unipolar memristors.

SUMMARY OF THE INVENTION

The present embodiments provide logic gates made of unipolar memristors. The logic gates provide blocks that allow for general digital logic design.

According to an aspect of some embodiments of the present invention there is provided logic gate apparatus, comprising:
a first resistive element; and
a second resistive element;
wherein the first and second resistive elements are connected together to form a voltage divider and one of said first and second resistive elements comprises a unipolar memristor.

In an embodiment, said second resistive element is a second unipolar memristor connected in series with the first unipolar memristor, thereby to form a section of an OR gate.

An embodiment may comprise a voltage source connected across the first and second resistive elements.

An embodiment may comprise a first capacitor connected in parallel with the first unipolar memristor, and a second capacitor connected in parallel with the second unipolar memristor.

In an embodiment, said second resistive element comprises a resistance connected in series with the unipolar memristor so as to form a section of a NOT gate.

An embodiment may comprise a first capacitor connected in parallel with the unipolar memristor, and a second capacitor connected in parallel with the resistance.

An embodiment may comprise a third memristor element connected via an OR gate to preserve a state of said first resistive element.

According to a second aspect of the present invention, there is provided digital logic apparatus, comprising a plurality of logic gates, wherein the gates are at least one of an OR gate and a NOT gate, each gate comprising at least one unipolar memristor.

In an embodiment, at least one of said gates is said OR gate, and said OR gate comprises:
a first unipolar memristor; and
a second unipolar memristor connected in series with the first unipolar memristor so as to form a section of said OR gate.

A first capacitor may be connected in parallel with the first unipolar memristor, and a second capacitor may be connected in parallel with the second unipolar memristor.

In an embodiment, at least one of said gates is said NOT gate, and said NOT gate comprises:
a unipolar memristor; and
a resistance connected in series with the unipolar memristor so as to form a section of a NOT gate. Again, a first capacitor may be connected in parallel with the unipolar memristor, and this time, the second capacitor is connected in parallel with the resistance.

In the various cases above, a first backup memristor and a second backup memristor may be respectively coupled via OR gates to the first unipolar memristor and the second unipolar memristor if present.

According to a third aspect of the present invention there is provided a method of constructing a logic circuit comprising:

forming at least two logic gates using unipolar memristors, and connecting said logic gates together.

In an embodiment, one of said logic gates is an OR gate, and the method comprises:

connecting a first unipolar memristor in series with a second unipolar memristor so as to form a section of said OR gate; and applying an initial voltage to the series so as to input a first logical state of the first unipolar memristor and a second logical state of the second unipolar memristor to the OR gate.

The method may comprise applying a further voltage to the series, subsequent to the initial voltage, so as to determine an output of the OR gate.

The method may comprise connecting a unipolar memristor in series with a resistance so as to form a section of a NOT gate; and then applying an initial voltage to the series so as to input a logical state to the NOT gate.

The method may comprise applying a further voltage to the series, subsequent to the initial voltage, so as to determine an output of the NOT gate.

In an embodiment, application of the initial voltage and the further voltage is for respective preset fixed durations in time.

In an embodiment, application of the initial voltage and the further voltage is for respective preset fixed durations in time.

An embodiment may involve applying the initial voltage during a preset stage of the OR gate, applying the further voltage during an evaluation stage of the OR gate, and further comprising applying another voltage between application of the initial voltage and further voltage, in a switching phase of the OR gate.

The method may involve inputting the state of the first and second memristor elements, during the preset stage, to the OR gate.

The method may comprise applying the initial voltage during a preset stage of the NOT gate, applying the further voltage during an evaluation stage of the NOT gate, and further comprising applying another voltage between application of the initial voltage and further voltage, in a switching phase of the NOT gate.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to a logic design using memristors and, more particularly, but not exclusively, to a set of two logic blocks that allow full logic systems to be constructed therefrom.

The present embodiments focus on logic with unipolar devices, and may provide a technique to construct OR and NOT logic gates with unipolar memristors that can be extended to execute any logical function. Embodiments are tested in simulations using a modified Verilog-A model, to fit $TiO_2$ thin film unipolar memristors. However, embodiments may be provided to suit any other unipolar materials, such as Phase Change Memory (PCM) materials, so that it will be understood that the method is relevant for any unipolar memristive device.

Unlike previously proposed logical techniques for unipolar memristors, the present technique is based on intuitive building blocks, in this case OR and NOT gates or logic blocks. Additionally, the present embodiments may be integrated into a memory since only resistance is used to represent logical values throughout the operation, just as data is stored within memristive memories, and no sensing nor transformation between logical representations is needed.

The basic concept of the proposed logic with unipolar memristors is described along with the basic building blocks of the proposed logic family, being in the present embodiments OR and NOT gates. Timing considerations for the logic gates are also discussed. The design of an advanced logic function is then demonstrated.

Figure 1B:
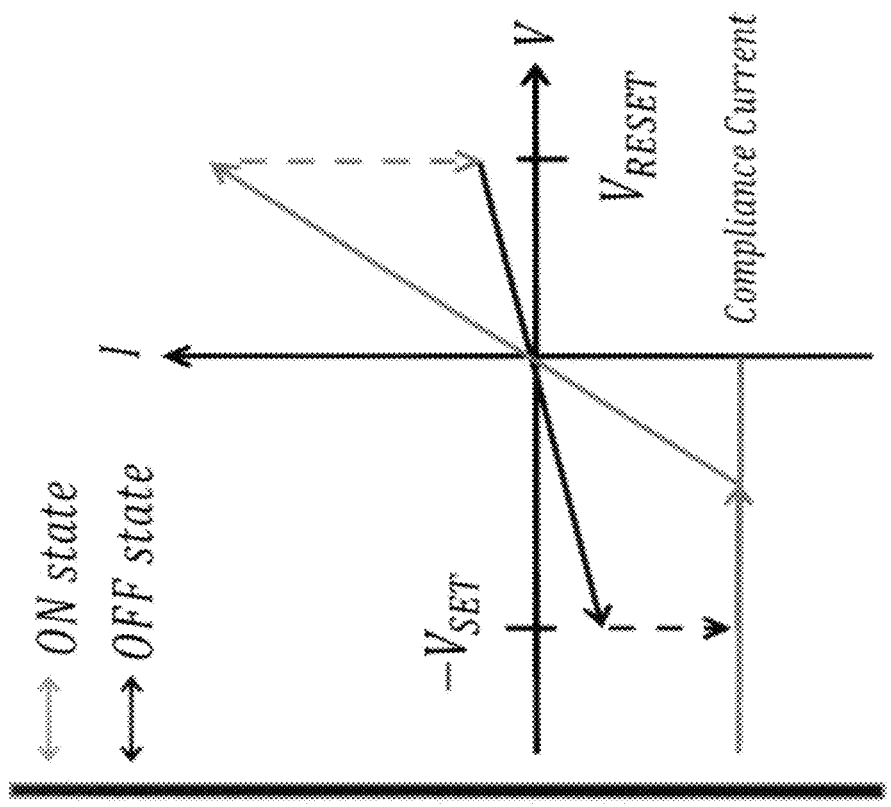
FIGS. 1A and 1B are simplified state diagrams showing unipolar and bipolar switching of existing memristor devices.
Figure 1A:
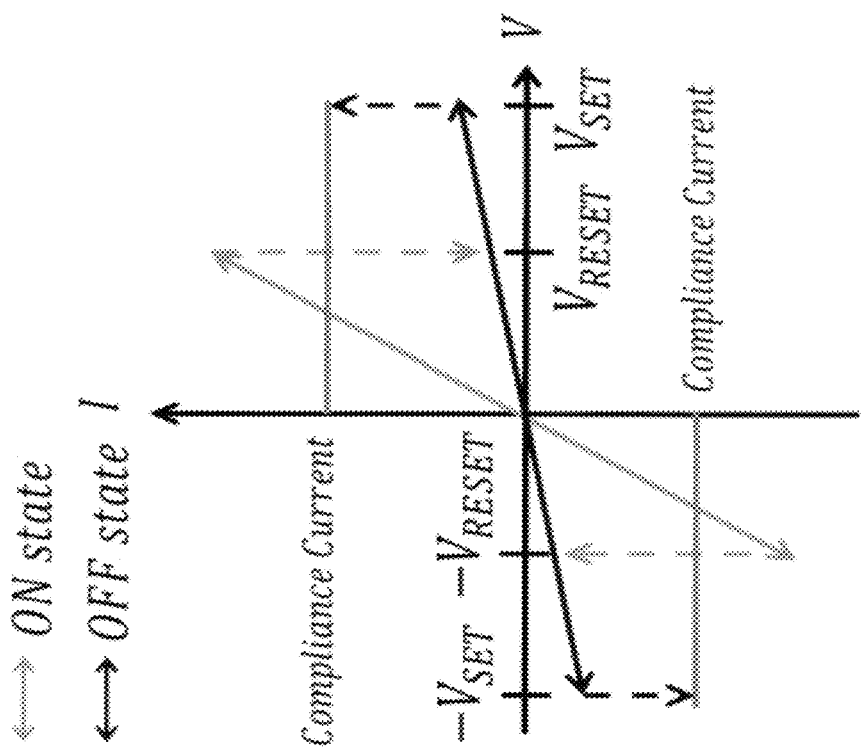

For purposes of better understanding some embodiments of the present invention, as illustrated in FIGS. 2-7B of the drawings, reference is first made to the FIGS. 1A and 1B which illustrate the concepts of unipolar and bipolar switching in memristors.

The classification of switching into unipolar and bipolar cases is illustrated in FIGS. 1A-1B. As discussed in the background, curves I-V of (a) unipolar and (b) bipolar switching mechanisms of memristors are shown. For bipolar switching, a transition from HRS→LRS (SET) occurs at a negative voltage ($-V_{SET}$), while the transition from LRS→HRS (RESET) occurs at a positive voltage ($V_{RESET}$). In the case of unipolar switching, a transition from HRS→LRS occurs when crossing a voltage threshold ($V_{SET}$ or $-V_{SET}$). Typically, the current during the transition may be limited below a compliance current to avoid overloading the device. Resetting back to the OFF state happens at a voltage below $V_{SET}$ and above $V_{RESET}$ (or above $-V_{SET}$ and below $-V_{RESET}$). A higher current is needed for switching to the OFF state. Thus unipolar switching is preferred in the present embodiments.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2:
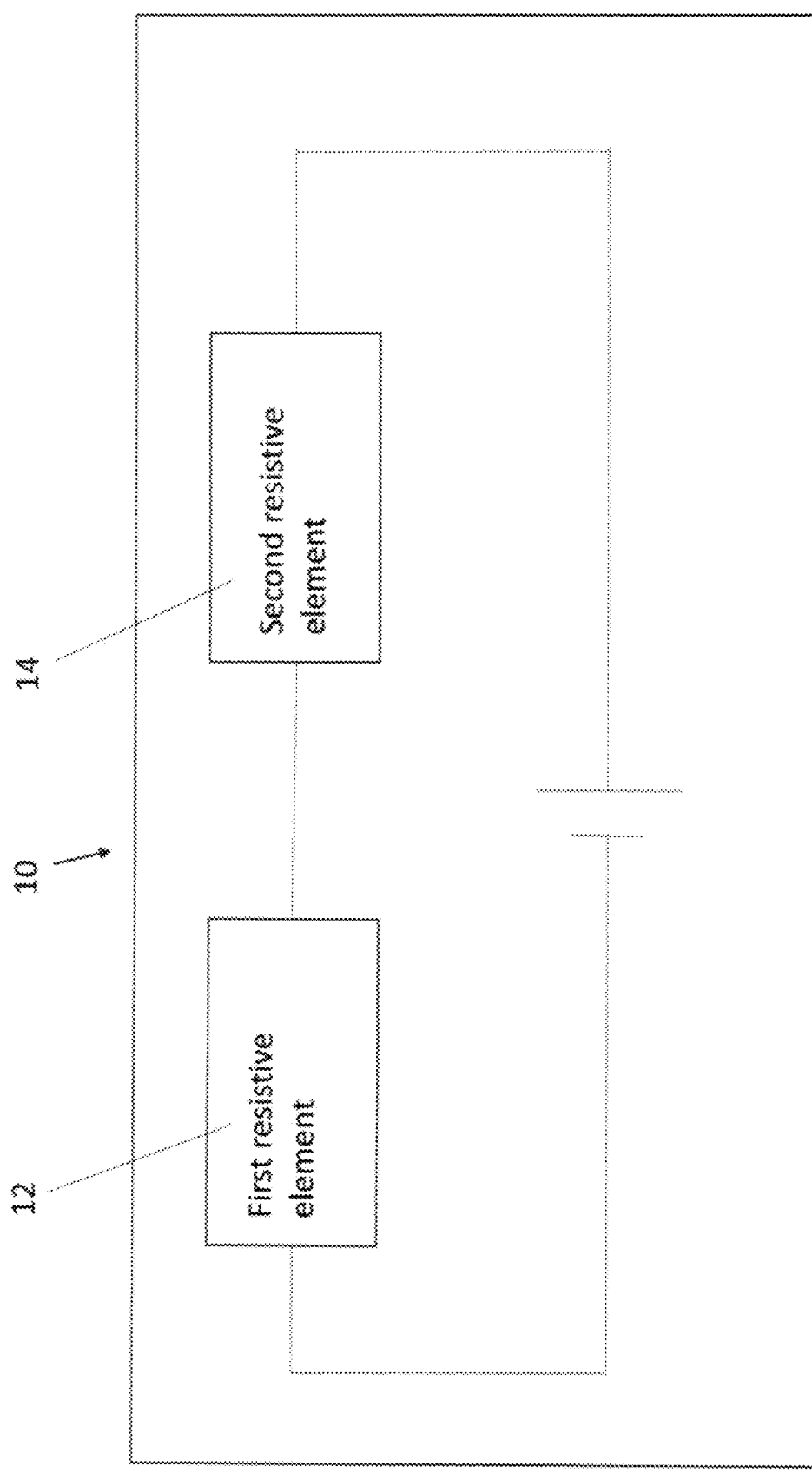
FIG. 2 is a simplified diagram showing a generalized logic element according to a first preferred embodiment of the present invention.

Referring now to the drawings, FIG. 2 illustrates a generalized logic element that uses a unipolar memristor as one of the resistive elements according to an embodiment of the present invention. Logic gate 10 comprises first resistive element 12 and second resistive element 14 connected together to form a voltage divider. One of the resistive elements is a unipolar memristor. The second resistive element is either a conventional resistive element or a unipolar memristor.

That is to say, the basic mechanism of the logic gates of the present embodiments is made up of a voltage divider between two resistive elements—a memristor and a resistor for a NOT gate or two memristors for an OR gate. On connecting two resistive elements in series and applying a voltage bias; the ratio of voltages on the two elements complies with the ratio of their resistance, i.e., the states are distinguished using a bias voltage. The first stage of operation is translating resistance to resistive states. The applied voltage needed to make a distinction is called the preset voltage.

After distinction between two states has been achieved, an additional voltage is applied to the circuit, adding a higher or lower applied voltage across both elements, regardless of their states. The voltage in this latter stage is predetermined to a value that promotes switching if necessary for proper execution, and the additional voltage is called the evaluation voltage. The operation may therefore comprise two execution stages—preset and switching. The first, or preset, stage may be thought of as setting up the input(s) for the gate. The second, or switching, stage may be thought of as operating the gate so as to find out, or determine, its output.

One obstacle to smooth operation of the circuits of the present embodiments arises from the fact that every change in resistance immediately changes the measured voltages, hence, possibly changing the distinction between states. The change may lead to an incorrect result. Therefore maintaining the initial voltage distinction may be required for a sufficient time to reach the desired resistance (HRS or LRS). One possible approach is to incorporate capacitors in the circuit in parallel with the memristors. Since capacitors take time to charge/discharge, they add delay to the system, and such capacitors may be referred to as suspension capacitors. In addition to prolonging the validity of voltage values in the switching stage, suspension capacitors may also delay the preset stage and in the case of the NOT gate, are typically necessary for correct operation. Furthermore, the transition from preset to switching stages cannot be instantaneous.

Figure 3:
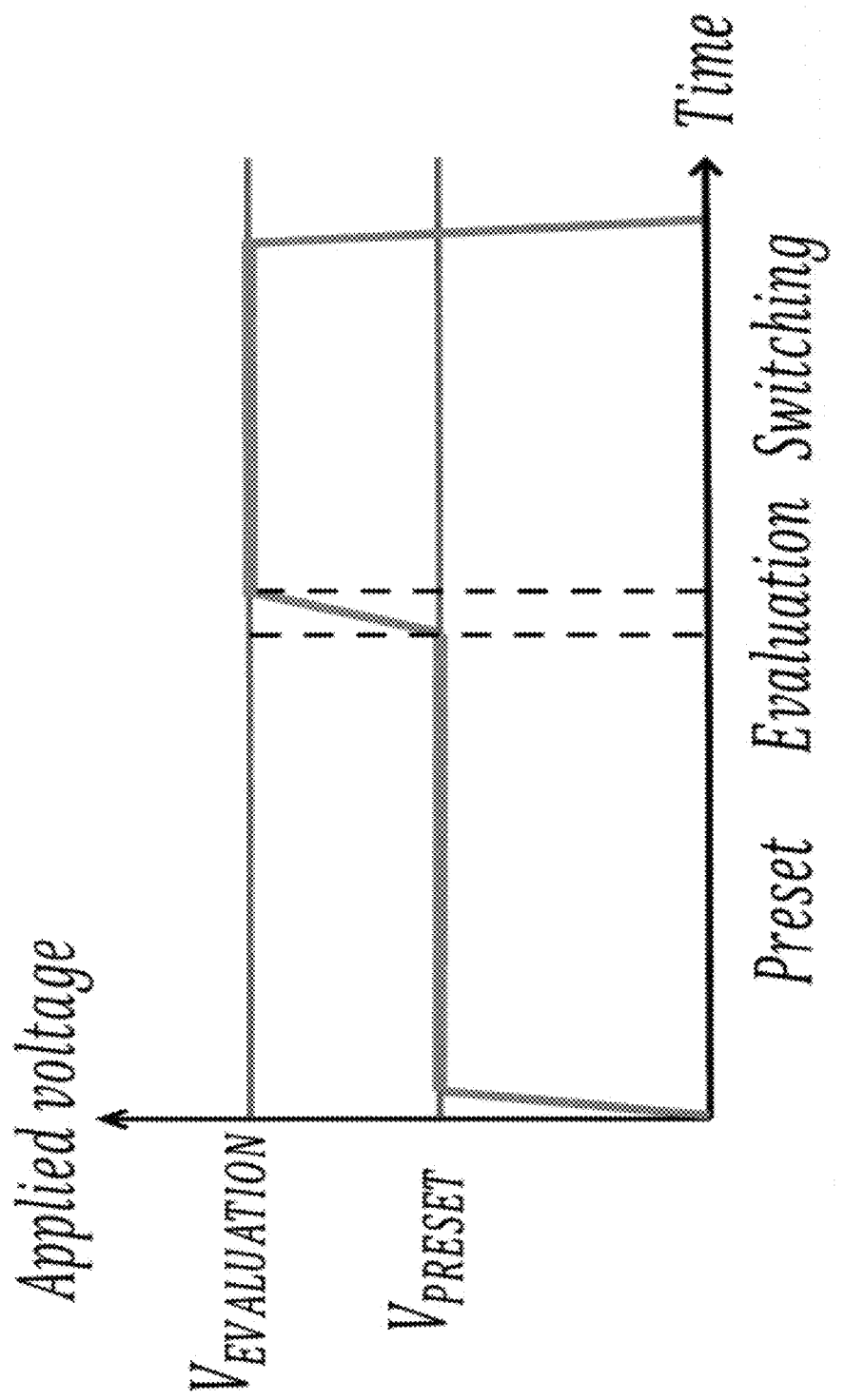
FIG. 3 is a simplified graph showing three stages of preset, evaluation and switching stages during a logic operation using the generalized logic element of FIG. 2.

Reference is now made to FIG. 3, which is a simplified graph that illustrates three states of the circuits of the present embodiments during a logic operation, preset, evaluation and switching. The intermediate evaluation stage is abstractly depicted as a transitive state and three stages are used to execute the operation as illustrated in FIG. 3. The preset voltage distinguishes between logical states and charges the suspension capacitors. The evaluation stage converts the preceding voltages to the required voltages for switching.

Preset Stage

In more detail, in the preset stage, a voltage V PRESET is applied to the circuit to charge the capacitors to initial voltage divider values. The applied voltage is high enough to distinguish between resistive states, but lower than the switching voltage. After sufficient time, approximately no current passes through the capacitors and their voltages are consistent with the voltage divider.

Evaluation Stage

The evaluation stage starts immediately after the preset stage. A voltage pulse $V_{EVALUATION}$ is applied to the circuit. The purpose of the evaluation stage is to increase the voltage on both elements abruptly. The final voltage in this stage depends on the final voltage of the preset stage, hence correlates with the resistance of the circuit elements. However, the voltage increase $V_{EVALUATION}$-$V_{PRESET}$ is typically fixed for all scenarios. The exact increase in voltage after the voltage jump is determined by the capacitance ratio (charge sharing). Generally, branches with less capacitance gain more of the voltage increase.

Switching Stage

In the switching stage, $V_{EVALUATION}$ is still applied for sufficient time to allow switching of the memristors. A pulse length and voltage magnitude may be selected to switch the memristors according to the desired logical functionality.

Or Gate

Figure 4:
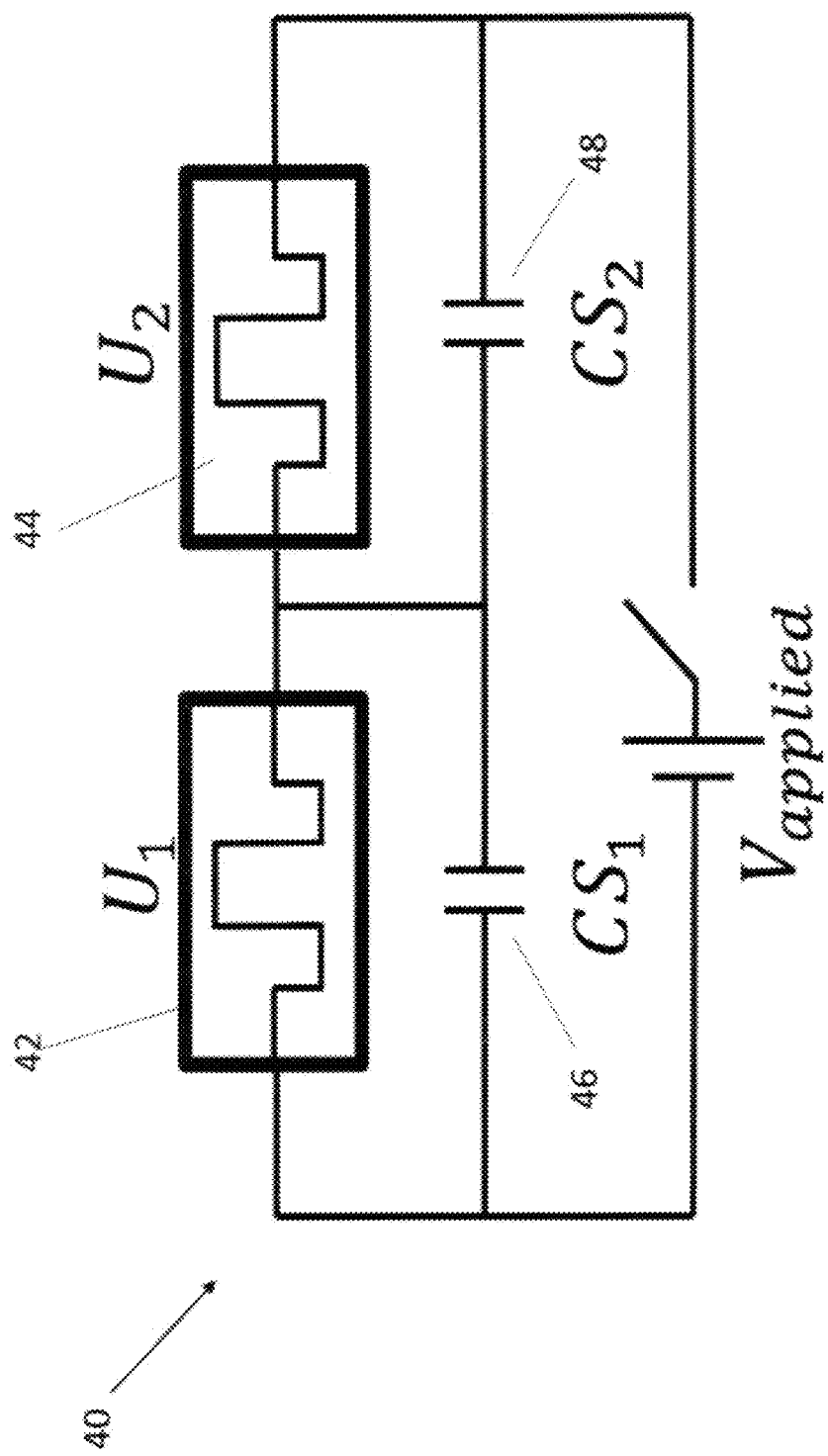
FIG. 4 is a simplified diagram showing an OR gate constructed using two unipolar memristor elements.

Reference is now made to FIG. 4, which illustrates a two-input OR gate according to the present embodiments. The OR gate 40 consists of two unipolar memristors $U_1$ and $U_2$ 42 and 44, connected in series with suspension capacitors 46 and 48 connected in parallel to each memristor. The initial logical state of the memristors is the input of the gate and after execution both memristors have the same logical state, which serves as the output of the gate.

We assume $V_{SET}>V_{RESET}$, and for correct behavior of the gate, certain conditions need to be fulfilled. First, when both inputs are identical (i.e., both are logical '1' or '0') there is no memristor switching. Second, when the inputs are different, the HRS memristor (in logical '0') has to switch to LRS since the desired output is logical '1'. The constraints on the voltages are therefore:

$$V_{PRESET} < 2V_{RESET}, \quad (1a)$$

Regarding condition (1a), for two memristors with the same input value, e.g., {LRS,LRS} no switching should occur. In this case the voltage on each one of them is 0.5*Vpreset. (If 0.5*Vpreset>Vreset we may cause LRS→HRS switching which is not desired.) The same applies for {HRS,HRS} but since Vreset<Vset the necessary condition is covered this as well.

$$2V_{SET} - V_{PRESET} < V_{EVALUATION} < 2V_{RESET}. \quad (1b)$$

Regarding condition (1b), the right side of the inequality is as for condition (1a), i.e., to avoid false switching when no switching should occur.

The left side of the inequality ensures switching occurs when it should. I.e. for {HRS,LRS}→{LRS,LRS} the voltage on the switching memristor at the beginning of the evaluation stage is approximately Vpreset+0.5*(Vevaluation−Vpreset). This should be larger than Vset.

Thus during operation, the input elements $U_1$, $U_2$ are overwritten with the output in terms of changed or unchanged memristive states.

Figure 5B:
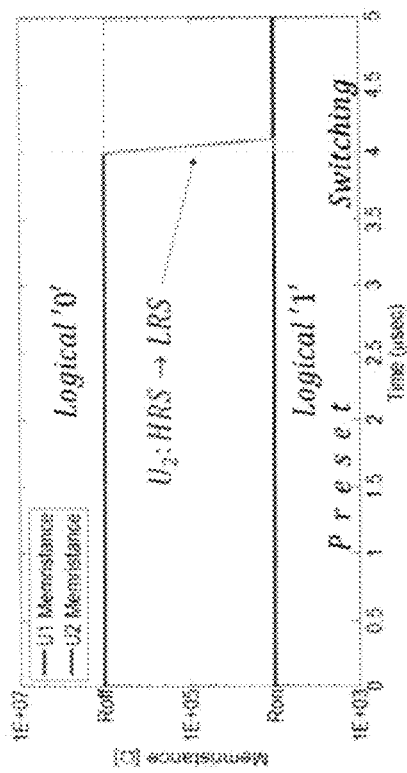
FIGS. 5A and 5B are simplified diagrams showing voltage and resistance respectively during a logic operation of the OR gate of FIG. 4.
Figure 5A:
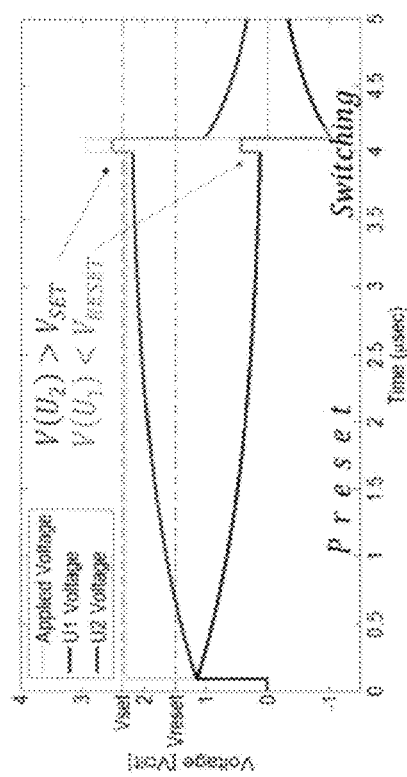

Reference is now made to FIGS. 5A and 5B, which show simulation results of an OR gate for the case where the inputs are different and $U_2$ switches for proper result. Note that when $U_1$ is logical '0' and $U_2$ logical '1', the operation is destructive, and the value of the inputs may be overwritten.

In greater detail, in FIGS. 5A and 5B, OR gate simulation results are shown. $U_1$ and $U_2$ are initialized to, respectively, LRS (logical '1') and HRS (logical '0') In FIG. 5A, voltages across the memristors during the operation are shown, and FIG. 5B shows the corresponding resistances. In the first 4 μsec the system is in the preset stage, and the capacitors are charged/discharged to distinctive voltages. In the switching stage, $U_2$ voltage is higher than $V_{set}$ for sufficient time and its logical value is switched to logical '1' as desired.

It will be understood that the voltage application during the preset stage inputs the state of the memristors, to the memristor combination acting as an OR gate, as either logical 1 or logical 0.

It will also be understood that FIGS. 5A and 5B illustrate one possible input of the two-input OR gate, and the resulting output. Those having ordinary skill in the art will be able to generate graphs illustrating the other three possible inputs of the OR gate, and respective resulting outputs. In particular a second set of graphs for inputs U1=1 and U2=0, is similar to 5A and 5B, but with labels reversed. For inputs U1=1 and U2=1 (or U1=0, U2=0) graphs in 5A overlay each other, and graph 5B is just a horizontal line at level Ron) and the voltages never climb above Vreset.

NOT Gate

Figure 6:
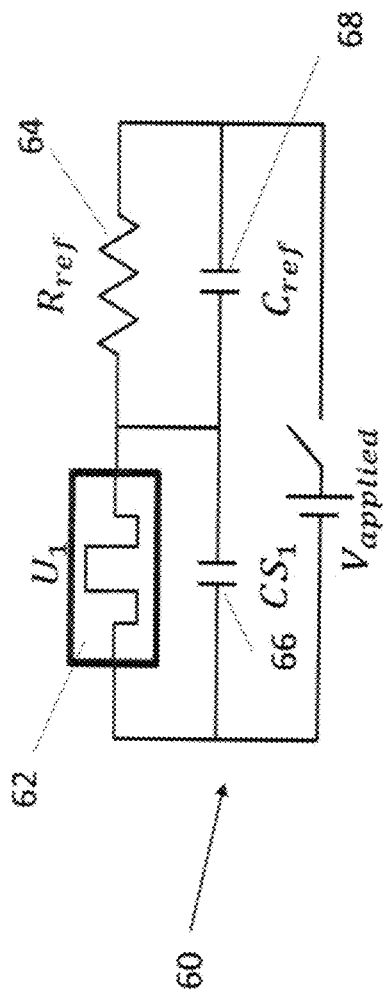
FIG. 6 is a simplified diagram showing a NOT gate constructed using a unipolar memristor element and a resistive element according to an embodiment of the present invention.

Reference is now made to FIG. 6, which is a simplified diagram illustrating a NOT gate according to the present embodiments and based on the generalized embodiment of FIG. 2. The NOT gate 60 consists of a single unipolar memristor 62 connected in series with a reference resistor 64. The memristor acts as both input and output of the NOT gate. Both the memristor and the resistor have a suspension capacitor, 66 and 68 respectively, connected to them in parallel. The resistor 64 may serve as a reference to determine the state of the memristor.

Figure 7A:
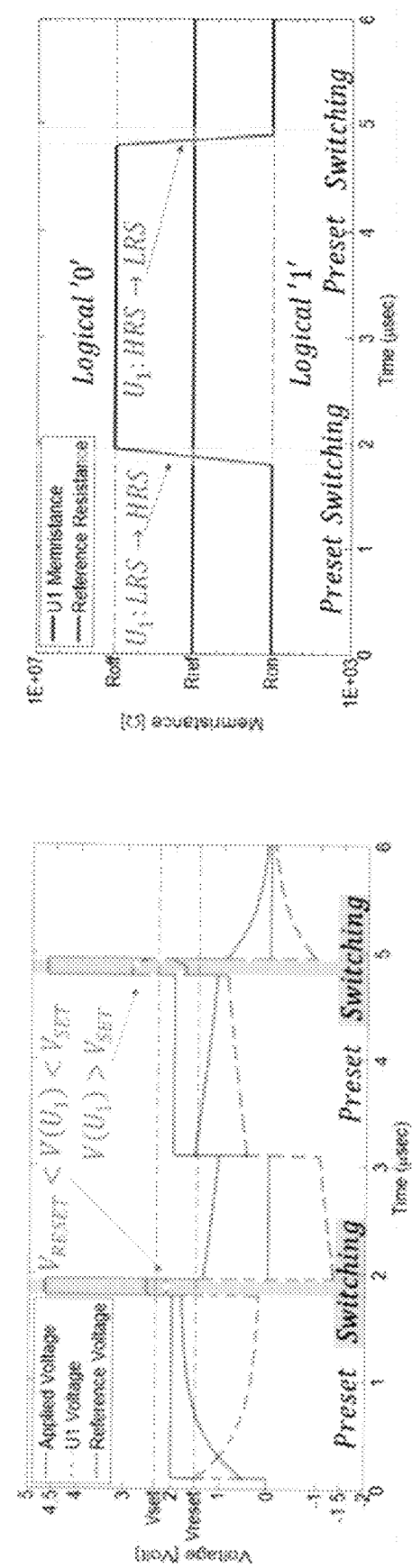
FIGS. 7A and 7B are simplified diagrams showing voltage and resistance respectively during a logic operation of the NOT gate of FIG. 6.
Figure 7B:
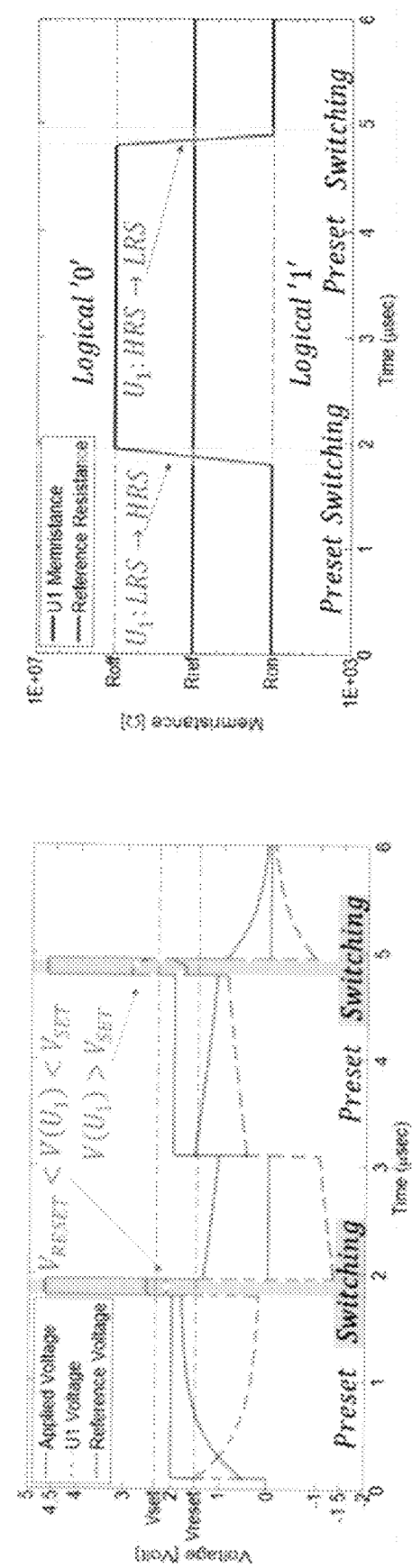

Reference is now made to the graphs of FIGS. 7A and 7B. Suspension capacitors 66 and 68 are typically necessary for proper operation of the NOT gate. Without the suspension capacitors, $V_{EVALUATION}$ may be high for correct switching in the case of RESET operations. The resistance of the reference resistor is typically between LRS and HRS. Such a value ensures that the voltage at the end of the preset stage across a HRS (LRS) memristor is high (low). A reasonable choice is $R_{REF} = \sqrt{R_{OFF} R_{ON}}$. In one embodiment, the conditions on the applied voltage are:

$$V_{PRESET} < \min\left\{\sqrt{\frac{R_{OFF}}{R_{ON}}} V_{RESET}, V_{SET}\right\}, \quad (2a)$$

$$V_{EVALUATION} > \frac{1}{\gamma}\max\{V_{SET}, V_{RESET} + V_{PRESET}\}, \quad (2b)$$

$$V_{EVALUATION} < \frac{1}{\gamma}(V_{SET} + V_{PRESET}), \quad (2c)$$

where $\gamma \triangleq \frac{C_{REF}}{C_{REF} C_{S_1}}$.

In greater detail, FIGS. 7A and 7B show simulation results for the NOT gate of FIG. 6. FIG. 7A shows voltages and FIG. 7B shows the corresponding resistance during two consecutive memristor switchings. In a first NOT operation, during the first 3 μsec, $U_1$ switches from LRS→HRS. In the second NOT operation, during the second 3 μsec, $U_1$ switches back to LRS.

Timing Considerations

One of the points for suitable behavior of the proposed logic technique is to apply the right voltage for a sufficient time during the switching stage. In this section, possible timing constraints in the switching stage are explored. Assume $\tau_{SET}$ ($\tau_{RESET}$) is a minimal transition time from HRS (LRS) to LRS (HRS). For successful switching, the duration of the switching stage may be greater than the minimal required switching time. The minimum condition on the length of the stage is therefore:

$$T_{pulse} > \max\{\tau_{set}, \tau_{reset}\} = T_{pulse,min}. \quad (3)$$

At the beginning of the switching stage, each memristor is biased with a voltage which promotes switching (if necessary). The validity of the specified voltage level is typically maintained for a short period of time, due to the use of suspension capacitors, but will eventually become invalid. If the switching stage is not terminated in time, a memristor may reach a voltage range which promotes the opposite transition, i.e., reverse switching. The maximal length of the switching stage may be determined according to the transient analysis of voltages in the circuit, and may be different for SET and RESET operations. For this purpose it is possible to define $T_{SET}$ ($T_{RESET}$) as the approximate period of time in which the conditions for a SET (RESET) operation are met. It is important to understand that while $\tau_{set}$ and $\tau_{reset}$ are properties of the memristor, $T_{SET}$ and $T_{RESET}$ are determined by the selection of the different circuit parameters, namely $V_{PRESET}$, $V_{EVALUATION}$, $R_{REF}$, $C_{REF}$, $C_S$, and $T_{PRESET}$. Hence, the maximum condition on the length of the switching stage is:

$$T_{pulse} < \min\{T_{SET}, T_{RESET}\} = T_{pulse,max}. \quad (4)$$

Figure 8:
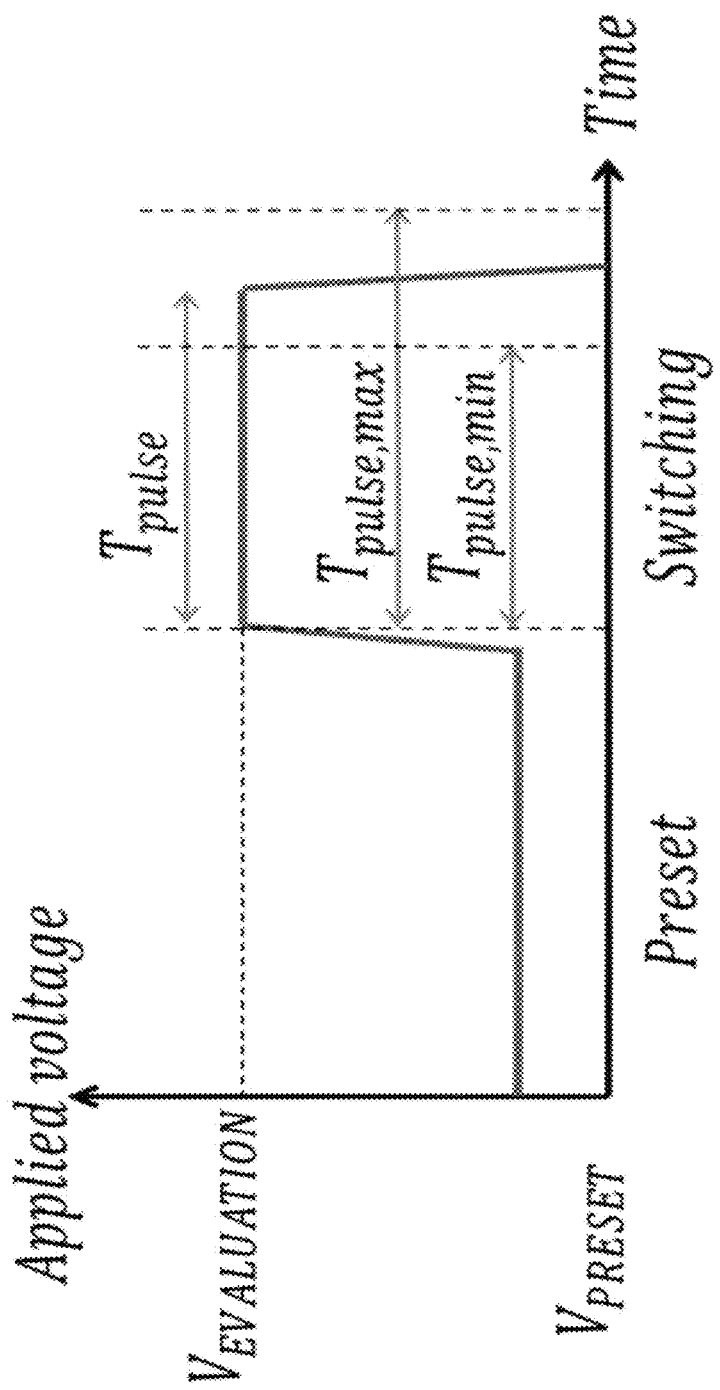
FIG. 8 is a simplified diagram showing applied voltage and time with the NOT gate of FIG. 6.

To comply with both minimum and maximum conditions, both (3) and (4) should apply, as illustrated in FIG. 8. FIG. 8 is a schematic graph showing applied voltage duration in the switching stage according to embodiments of the present invention. $T_{pulse}$ satisfies condition (3) to reach the desired resistance and also meets condition (4) to avoid reverse switching. The parameters $V_{PRESET}$, $V_{EVALUATION}$, $R_{ref}$ and the switching capacitors can be chosen to support (3) and (4). Different circuit parameters, however, may lead to a reduction in performance. For example, larger capacitors ease the maximum condition, but slow the preset stage and increase power consumption.

Advanced Logic Functions

OR and NOT functions, such as in the gates illustrated above, may form a complete logic structure, and any desired digital logic function may be reduced to a combination of OR and NOT gates using suitable logic reduction and mapping techniques.

One difference between the suggested logic gates and conventional CMOS logic is the destructive nature of the operations, i.e. the result of the operation overwrites the input. To resolve this issue a backup memristor with a copy of the initial value can be assigned through an OR operation with a memristor which is initialized to HRS.

Figure 9A:
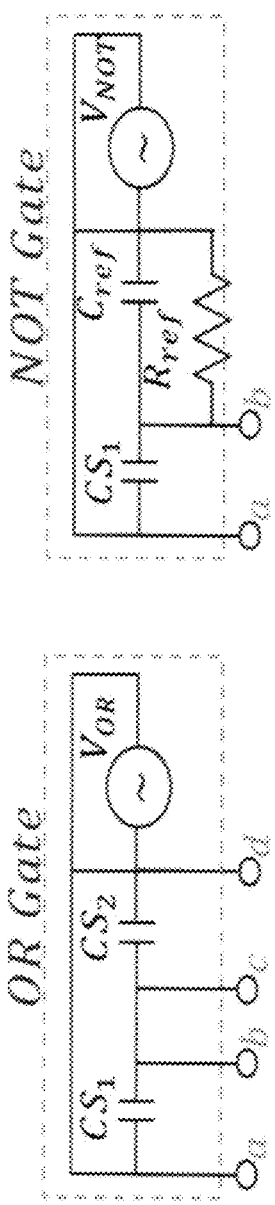
FIGS. 9A and 9B are simplified diagrams showing OR and NOT gates according to the present embodiments and showing how they can be used to construct a NAND gate.
Figure 9B:
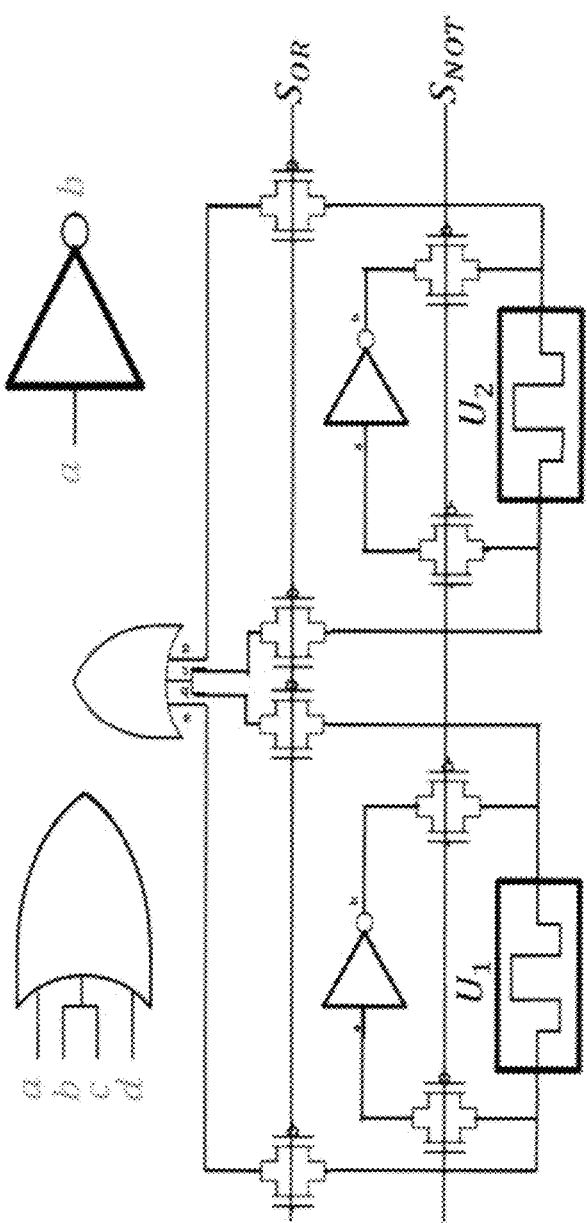

To perform advanced logic operations, a function may be disassembled to its basic ingredients (OR, NOT). Each basic function of the computation may occur at a different time, and in a predetermined order. Reference is now made to FIG. 9A which illustrates a CMOS-based passgate design to select which logic operation (OR/NOT) to perform. An example of NAND($U_1$, $U_2$) operation is listed in Table 1. The schematic of a NAND gate and how it may be constructed from elements according to the present embodiments using Table 1 is shown in FIG. 9B.

TABLE I

NAND operation using a sequence of OR and NOT gates

| Stage | Operation | Logical | $S_{OR}$ | $S_{NOT}$ |
|---|---|---|---|---|
| 1a | NOT | $U_1 \leftarrow \overline{U_1}$ | 0 | 1 |
| 1b | NOT | $U_2 \leftarrow \overline{U_2}$ | 0 | 1 |
| 2 | OR | $U_1 \leftarrow \overline{U_1} + \overline{U_2}, U_2 \leftarrow \overline{U_1} + \overline{U_2}$ | 1 | 0 |

More particularly, FIG. 9A shows OR and NOT gate symbols and schematics and FIG. 9B shows a schematic of a NAND gate based on the OR and NOT gates of the present embodiments. The signals $S_{OR}$ and $S_{NOT}$ control the sequence of operations through the CMOS passgates.

Figure 10:
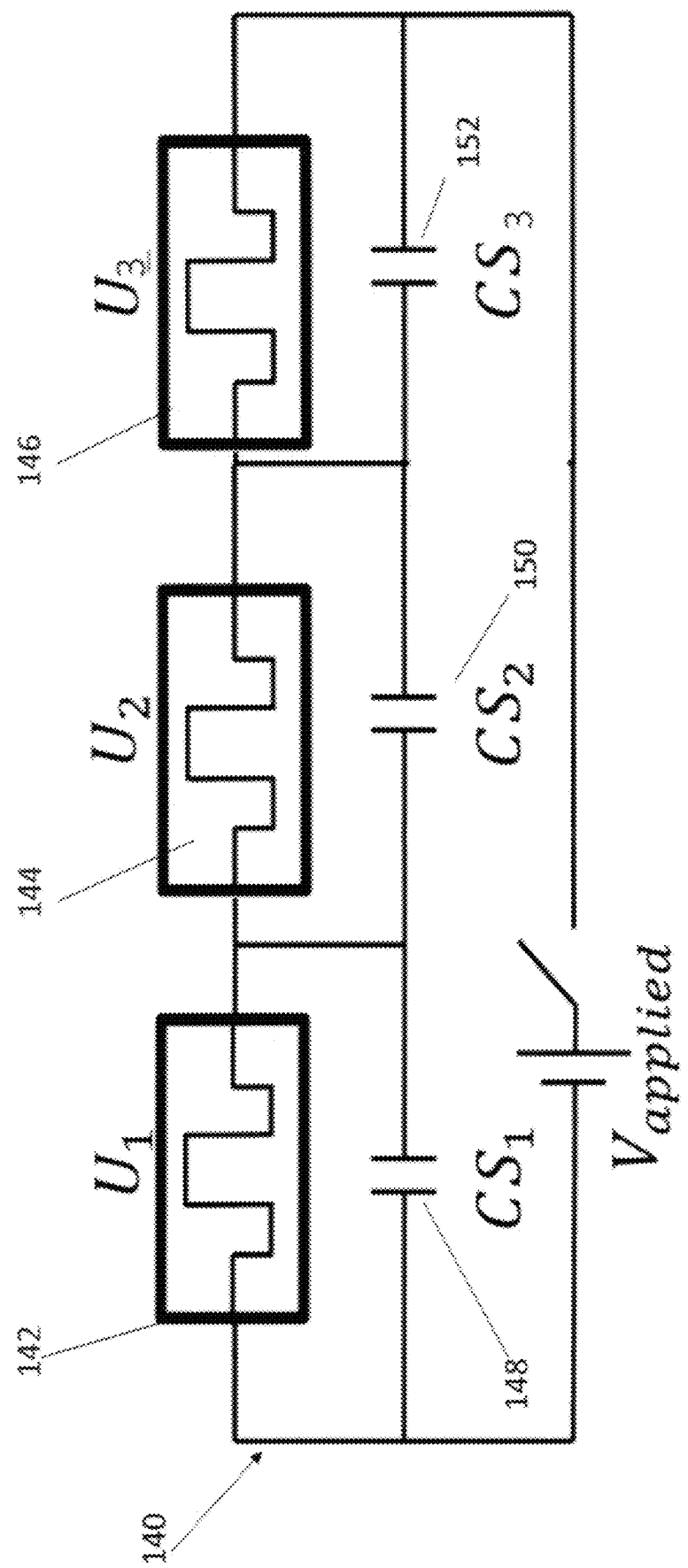
FIG. 10 is a simplified diagram showing gates constructed using three memristor elements connected together.

Reference is now made to FIG. 10, which illustrates three unipolar memristors connected together according to the present embodiments. Arrangement 140 consists of three unipolar memristors $U_1$ $U_2$ and $U_3$ 142, 144 and 146, connected in series with suspension capacitors 148, 150 and 152 connected in parallel to each memristor respectively.

As research into memristors progresses, using these novel devices for logic computations becomes more appealing and opens opportunities to combine computation and memory. In the present embodiments, a logic technique for unipolar memristors is described using OR and NOT gates. Computation speed is proportional to the intrinsic switching time of the device, and thus performance of systems using the present embodiments may be modified. Likewise different circuit and device parameters may improve control.

Incorporating the present embodiments into a logic system within a memory may serve as the foundation for a memory based computer architecture. The present embodiments destroy the input state, although additional circuitry can be provided to preserve the input state as discussed herein. It is thus possible using the present embodiments to compute any desired function that conventional digital logic is able to compute.

Execution of the suggested method with other devices and technologies, such as phase-change memory, has been tested and has also proven feasible.

It is expected that during the life of a patent maturing from this application many relevant memristor technologies will be developed and the scope of the term 'memristor' is intended to include all such new technologies a priori.

The terms "comprises", "comprising", "includes", "including", "having" and their conjugates mean "including but not limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. Logic gate apparatus, comprising:
   a first resistive element; and
   a second resistive element;
wherein the first and second resistive elements are connected together to form a voltage divider and one of said first and second resistive elements comprises a unipolar memristor, and said second resistive element comprises a resistance connected in series with the unipolar memristor so as to form a section of a NOT gate, the logic apparatus further comprising a first capacitor connected in parallel with the unipolar memristor, and a second capacitor connected in parallel with the resistance.

2. The logic gate apparatus according to claim 1, and comprising a voltage source connected across the first and second resistive elements.

3. Logic gate apparatus according to claim 1, wherein the second resistive element is a conventional resistor, thereby to provide a NOT gate with a single unipolar resistor.

4. Digital logic apparatus, comprising a plurality of logic gates, each gate comprising at least one unipolar memristor, wherein at least one of said gates is a NOT gate, and said NOT gate comprises:
   a unipolar memristor;
   a resistance connected in series with the unipolar memristor so as to form a section of a NOT gate; and
   a first capacitor connected in parallel with the unipolar memristor, and a second capacitor connected in parallel with the resistance.

5. The digital logic apparatus according to claim 4, and comprising a backup memristor which is coupled via an OR gate to the unipolar memristor.

* * * * *